United States Patent
Matsuo

(10) Patent No.: US 7,232,958 B2
(45) Date of Patent: Jun. 19, 2007

(54) APPARATUS AND METHOD FOR FIXING COMPONENT OF CIRCUIT SUBSTRATE

(76) Inventor: Haruyuki Matsuo, c/o Mitsubishi Electric Engineering Company Limited, 1-13-5, Kudankita, Chiyoda-Ku, Tokyo 102-0073 (JP)

( * ) Notice: Subject to any disclaimer, the term of this patent is extended or adjusted under 35 U.S.C. 154(b) by 113 days.

(21) Appl. No.: 11/003,973

(22) Filed: Dec. 6, 2004

(65) Prior Publication Data
US 2005/0167155 A1   Aug. 4, 2005

(30) Foreign Application Priority Data
Jan. 29, 2004   (JP)   ............................. 2004-021620

(51) Int. Cl.
*H05K 1/16* (2006.01)
(52) U.S. Cl. .................. 174/260; 174/535; 361/801
(58) Field of Classification Search ................ 174/260, 174/535–545; 361/752–759, 801, 802; 29/834–839
See application file for complete search history.

(56) References Cited

U.S. PATENT DOCUMENTS 4,812,950 A * 3/1989 Oyamada .................... 361/684
6,323,440 B1 * 11/2001 Maruyama et al. ......... 174/262

FOREIGN PATENT DOCUMENTS

JP    5-343898 A    12/1993
JP    09-083199 A   3/1997

* cited by examiner

*Primary Examiner*—Jeremy C. Norris
(74) *Attorney, Agent, or Firm*—Sughrue Mion, PLLC

(57) ABSTRACT

A component fixing device capable of improving vibration resistance by fixing a component onto a circuit substrate without inhibiting productivity and, of accurately inserting a lead of the component into the circuit substrate. The component fixing device is provided with a circuit substrate having a printed wiring or the like, a mounting component having a package including electronic components forming an electronic circuit together with the print wiring and an external lead for connecting the electronic components to the print wiring and the like, and a holder made from an insulating material such as a synthetic resin, the holder being fixed to the circuit substrate and holding the mounting component. The holder is provided with holding members for holding and fixing the package of the mounting component and lead holes for guiding the lead to a through hole of the circuit substrate.

4 Claims, 2 Drawing Sheets

APPARATUS AND METHOD FOR FIXING COMPONENT OF CIRCUIT SUBSTRATE

BACKGROUND OF THE INVENTION

1. Field of the Invention

The present invention relates to an apparatus and a method for fixing a component such as a hole IC type current sensor in the case of mounting the component on a circuit substrate.

2. Description of the Related Art

In the case of using a circuit substrate on which a large component such as a hole IC type current sensor with a plurality of lead wires and a power transistor is mounted, since the component is held by the rigidity of the lead wires soldered on the circuit substrate, problems of unreliable vibration resistance during use and erroneous positioning of the component due to deformation of the lead wires during the manufacture process occur. Also, when inserting the lead wires of the component into a through hole of the circuit substrate, a problem of greatly inhibiting productivity of mounting work occurs since it is difficult to perfectly match the position of lead of the component with the position of the through hole of the circuit substrate.

Therefore, it is necessary to use adhesive resin to fix the component to the circuit substrate in order to overcome the unreliable vibration resistance, and it is necessary to add a position correction step to the manufacture process in order to ensure the position retention. Further, in order to overcome the mismatch between the lead position of the component and the through hole position of the circuit substrate, a component mounting device capable of mounting the component simultaneously with correcting the lead position using a jig, a lead insertion method for inserting a component with a multiple of leads, and so forth have been proposed.

For instance, according to the technique disclosed in Patent Literature 1, an insertion jig is provided at a mounting position of a circuit substrate on a conveyer so that a lead terminal of the mounting component is inserted into an insertion hole such as a through hole of the circuit substrate via a guide hole of the insertion jig, wherein a direction unit inclined toward the inside of the guide hole is formed around a rim of an opening at the insertion side of the guide hole of the insertion jig, so that the lead terminal is directed to the guide hole from the direction unit even if there is a positional variation in lead terminal which is the mounting component, thereby enabling the lead terminal to be inserted into the insertion hole of the circuit substrate.

Also, according to the technique disclosed in Patent Literature 2, a jig for conveying and mounting a component on a circuit substrate is provided with lead aligning members which sandwiches the lead therebetween to retain the position of the lead, and a slope in the shape of a taper is formed in an opening of a depression which is formed at a predetermined position to retain the lead position, so that when the lead aligning members perform positioning of the lead of the mounting component, the lead slides into the depression owing to the tapered slope to be retained at the position of an insertion hole of the circuit substrate even if there is a variation in lead position.

Patent Literature 1: JP-A-09-083199 (page 4 and FIGS. 9 and 10)

Patent Literature 2: Jp-A-05-343898 (page 5 and FIGS. 5 to 8)

SUMMARY OF THE INVENTION

As described above, the position of the mounting component on the circuit substrate is corrected in the process step after the mounting, and the strength is reinforced by using a resin or the like. However, the correction step inhibits the productivity, and the strength reinforcement inhibits the flow of production because it requires curing after applying or filling the resin. The positioning jig disclosed in Patent Literatures 1 and 2 is required only for the lead position correction, and it is preferable to avoid the use of the positioning jig for the purpose of improving the productivity. In an automatic insertion line, it is necessary to accurately position the jig and the circuit substrate to be conveyed since a slightest positioning error might cause an insertion failure.

This invention has been accomplished in the aim of solving the above problems, and an object thereof is to provide an apparatus and a method for fixing a component, the apparatus and the method being capable of improving vibration resistance by fixing the component onto the circuit substrate without inhibiting productivity and, of inserting a lead of the component into a correct position.

A circuit substrate component fixing apparatus of this invention comprises: a circuit substrate on which a component is to be mounted to form an electronic circuit; a mounting component mounted on the circuit substrate and having a package including an electronic component and an external lead for providing connection between the electronic component and the circuit substrate; and a holder for holding the mounting component, which is fixed to the circuit substrate and made from an insulating material, wherein the holder is provided with a holding unit for holding and fixing the package of the mounting component and a lead hole for guiding the external lead to a through hole of the circuit substrate.

A circuit substrate component fixing method of this invention comprises: fixing onto a circuit substrate a holder having a holding unit for sandwiching a package of a mounting component and a lead hole for guiding a lead of the mounting component to a through hole of the circuit substrate; tapering the lead hole of the holder in such a fashion that a diameter of the lead hole on a mounting component insertion side becomes a larger diameter; and forming the holding unit except for at least the mounting component insertion side into a size that enables the holding unit to sandwich the mounting component, wherein, by inserting the mounting component into the holder, the lead is inserted into the through hole of the circuit substrate at the same time when the mounting component is held and fixed by the holder.

According to the circuit substrate component fixing apparatus and method of the above constitutions, only by inserting the mounting component into the holder to reach a predetermined depth of the holder when mounting the mounting component on the circuit substrate, the position of the lead is corrected so that the lead is accurately inserted into the through hole, and the mounting component is securely fixed onto the holder to ensure the vibration resistance. Therefore, it is possible to efficiently produce the circuit substrate products excellent in vibration resistance and to improve the position accuracy of the mounting component without using a special jig or device in the assembly and without setting a process step which inhibits the production flow.

DESCRIPTION OF THE PREFERRED EMBODIMENTS

First Embodiment

Figure 1:
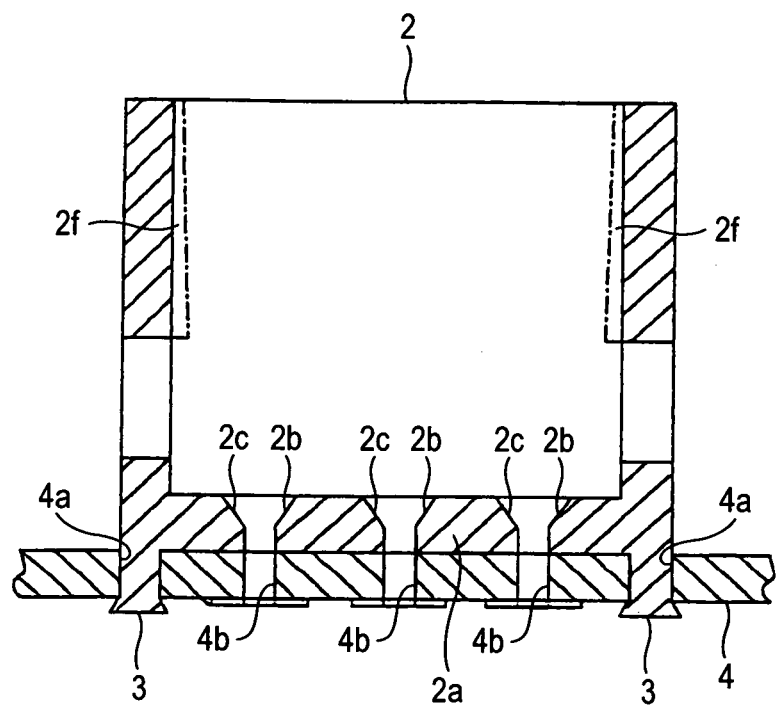
FIG. 1 is a sectional view showing a holder to be used in a circuit substrate component fixing apparatus according to a first embodiment of this invention.
Figure 2:
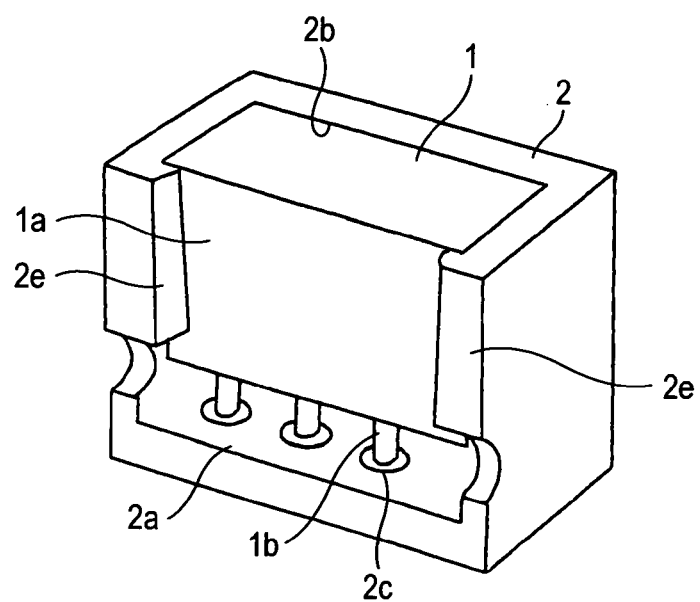
FIG. 2 is a perspective view showing an assembled state of the circuit substrate component fixing apparatus according to the first embodiment of this invention.
Figure 3:
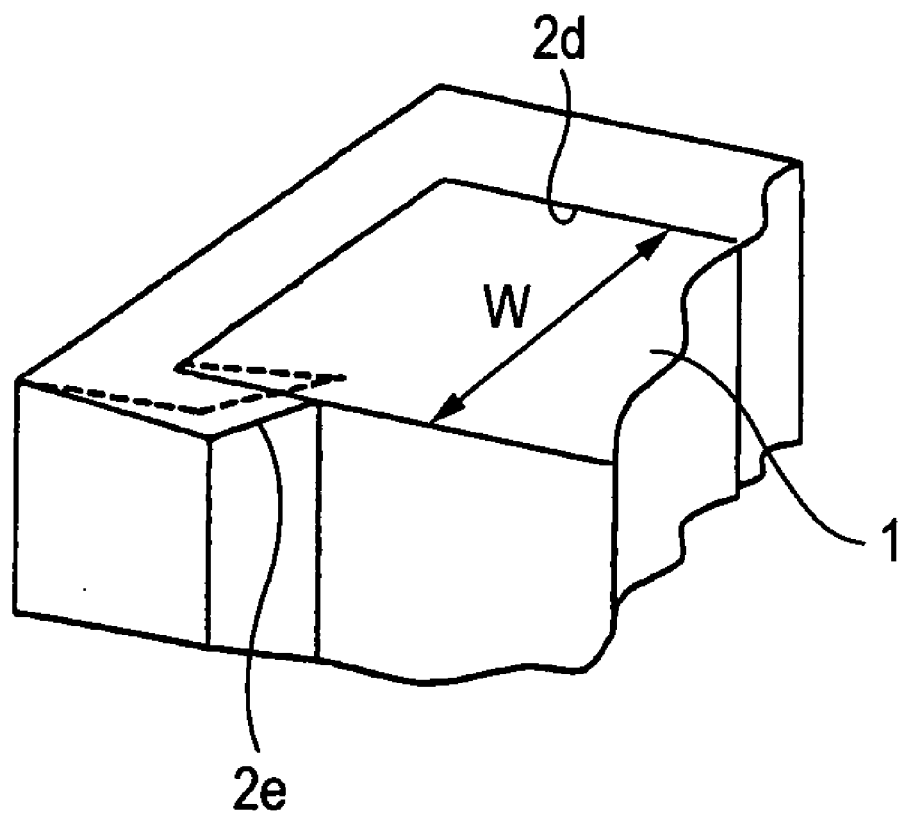
FIG. 3 is an illustration of a component fixing state of the circuit substrate component fixing apparatus according to the first embodiment of this invention.

FIGS. 1 and 3 are illustration of a circuit substrate component fixing apparatus and a circuit substrate component fixing method according to a first embodiment of this invention. FIG. 1 is a sectional view showing a holder to be attached to a circuit substrate to hold a mounting component and to perform positioning when the mounting component is mounted; FIG. 2 is a perspective view showing a state in which the holder attached to the circuit substrate is holding the mounting component; and FIG. 3 is an illustration of a fixed state of the mounting component.

Referring to the drawings, a holder 2 holding a mounting component 1 is made from an insulting material such as a synthetic resin. Fixing legs 3, for example, of the holder 2 are inserted into fixing holes 4a of a circuit substrate 4 so that the holder 2 is fixed to the circuit substrate 4 by thermal caulking or the like. A bottom 2a of the holder 2 contacting the circuit substrate 4 is provided with lead holes 2b which match with positions of through holes 4b of the circuit substrate 4 at lead positions of the mounting component 1. A taper 2c is formed in each of the lead holes 2b in such a fashion that a surface facing to the mounting component 1 has a larger diameter. The mounting component 1 inserted into the holder 2 is held resiliently between a rear face 2d of the holder 2 and a holding member 2e on a front face of the holder 2 as shown in FIG. 3, for example.

More specifically, the mounting component 1 has a package 1a for including electronic components and a lead 1b for connecting the electronic components to a wiring of the circuit substrate 4, and the package 1a is fixed to the holder 2. The shape indicated by a dotted line in FIG. 3 is the shape of the holder 2 as molded, and the shape indicated by a solid line is the shape of the holder 2 after the resilient deformation by the insertion of the mounting component. Therefore, though a width (w in FIG. 3) between the rear face 2d and the holding member 2e of the front face of the holder 2 is set to be less than a width of the package 1a of the mounting component 1 in the holding portion, a width of an insertion portion (upper portion in FIG. 3) of the mounting component 1 is set to a value larger than the width of the package 1a for easy insertion, and at least the holding member 2e has resiliency.

In the thus-constituted component fixing apparatus according to the first embodiment, the holder 2 is attached to the circuit substrate 4 at a required position by, for example, the thermal caulking before feeding the circuit substrate 4 into an assembly line. When the mounting component 1 is assembled in the assembly line, by inserting the mounting component 1 into the holder 2, the mounting component 1 is sandwiched between the rear face 2d and the holding members 2e of the holder 2 to be fixed to the circuit substrate 4 by the holder 2, and the lead 1a of the mounting component 1 is guided along the shape of the taper 2c to be inserted into the lead holes 2b and then accurately inserted into the through holes 4b of the circuit substrate 4. The lead 1a is then connected to the printed wiring by soldering or the like.

Thus, by inserting the mounting component 1 into the holder 2 to a predetermined depth of the holder 2 in the assembly line, the positioning of the lead 1a and vibration resistance of the mounting component 1 are ensured, thereby enabling to efficiently produce circuit substrate products excellent in vibration resistance without using a special device in the assembly line and without setting a process step which inhibits a production flow. As shown in FIG. 1, the vibration resistance can be improved by providing rib-like projections 2f for holding the mounting component 1 on an inner surface of the holder 2. By combining the holding by the rear face 2d and the holding members 2e of the holder 2 with the rib-like projections 2f, the vibration resistance will be further improved.

The circuit substrate component fixing apparatus and method according to this invention are usable for mounting on a circuit substrate a power component of a controller which requires the vibration resistance, such as an on-vehicle controller, and an IC type current sensor.

What is claimed is:

1. A circuit substrate component fixing apparatus, comprising:
   a circuit substrate on which a component is to be mounted to form an electronic circuit;
   a mounting component mounted on the circuit substrate and having a package including an electronic component and an external lead for providing connection between the electronic component and the circuit substrate; and
   a holder for holding the mounting component, which is fixed to the circuit substrate and made from an insulating material, wherein
   the holder is provided with a holding unit for holding and fixing the package of the mounting component and a lead hole for guiding the external lead to a through hole of the circuit substrate,
   wherein the holding unit comprises a first substantially flat surface opposing a second substantially flat surface which each, respectively, contact opposing surfaces of the mounting component,
   a third substantially flat surface parallel to the second substantially flat surface,
   wherein the second substantially flat surface and the third substantially flat surface each contact only a portion of a same opposing surface of the mounting component.

2. The circuit substrate component fixing apparatus according to claim 1, wherein
   the lead hole of the holder is tapered in such a fashion that a diameter of the lead hole on a mounting component insertion side becomes a larger diameter.

3. A circuit substrate component fixing apparatus comprising:
   a circuit substrate on which a component is to be mounted to form an electronic circuit;
   a mounting component mounted on the circuit substrate and having a package including an electronic component and an external lead for providing connection between the electronic component and the circuit substrate; and a holder for holding the mounting component, which is fixed to the circuit substrate and made from an insulating material, wherein the holder is provided with a holding unit for holding and fixing the package of the mounting component and a lead hole for guiding the external lead to a through hole of the circuit substrate, wherein the holding unit comprises a first substantially flat surface opposing a second substantially flat surface which each, respectively, contact opposing surfaces of the mounting component, wherein the holding unit of the holder is resilient and a first width between the first substantially flat surface and the second substantially flat surface is smaller than a second width in the same direction between the opposing surfaces of the electronic component.

4. A circuit substrate component fixing method, comprising:

fixing onto a circuit substrate a holder having a holding unit for sandwiching a package of a mounting component and a lead hole for guiding a lead of the mounting component to a through hole of the circuit substrate;

tapering the lead hole of the holder in such a fashion that a diameter of the lead hole on a mounting component insertion side becomes a larger diameter; and forming the holding unit to comprise a first substantially flat surface opposing a second substantially flat surface which each contact opposing surfaces of the mounting component to enable the holding unit to sandwich the mounting component and a third substantially flat surface parallel to the second substantially flat surface, wherein the second substantially flat surface and the third substantially flat surface each contact only a portion of a same opposing surface of the mounting component, wherein by inserting the mounting component into the holder, the lead is inserted into the through hole of the circuit substrate at the same time when the mounting component is held and fixed by the holder.

* * * * *

UNITED STATES PATENT AND TRADEMARK OFFICE
CERTIFICATE OF CORRECTION

PATENT NO. : 7,232,958 B2
APPLICATION NO. : 11/003973
DATED : June 19, 2007
INVENTOR(S) : Haruyuki Matsuo It is certified that error appears in the above-identified patent and that said Letters Patent is hereby corrected as shown below:

Title Page, Please Add:
(73), Assignee: --Mitsubishi Denki Kabushiki Kaisha, Tokyo (JP)--.

Signed and Sealed this

Fourth Day of December, 2007

JON W. DUDAS
*Director of the United States Patent and Trademark Office*